Figure 1:
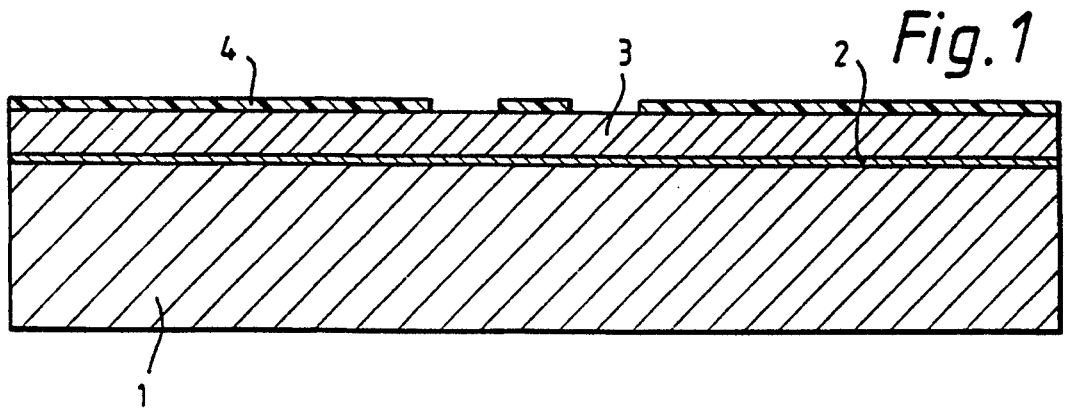

United States Patent [19]

Plumb

[11] Patent Number: 5,341,002
[45] Date of Patent: Aug. 23, 1994

[54] SEMICONDUCTOR LIGHT EMITTING DEVICE WITH RIDGED CONTACT

[76] Inventor: Richard G. Plumb, Birch House Farm, Chattisham, Ipswich, Suffolk, England, IP8 3QQ

[21] Appl. No.: 800,924

[22] Filed: Dec. 4, 1991

[30] Foreign Application Priority Data

Jun. 7, 1989 [GB] United Kingdom ............... 8913070

[51] Int. Cl.$^5$ ............................................. H01L 33/00
[52] U.S. Cl. ............................... 257/95; 257/99; 257/101; 257/622; 372/48; 372/45; 372/46; 437/906; 437/23; 437/24
[58] Field of Search .................. 357/17, 55, 16, 91, 357/68; 372/48, 46, 45; 437/905, 20, 23, 48, 22, 24, 906

[56] References Cited

U.S. PATENT DOCUMENTS

| | | | |
|---|---|---|---|
| 4,447,905 | 5/1984 | Dixon et al. | 372/46 |
| 4,521,887 | 6/1985 | Liu et al. | 372/46 X |
| 4,523,961 | 6/1985 | Hartman et al. | 372/46 X |
| 4,539,743 | 9/1985 | Anthony et al. | 372/46 X |
| 4,639,275 | 1/1987 | Holonyak, Jr. | 372/46 X |
| 4,980,314 | 12/1990 | Strege | 372/48 X |
| 5,107,514 | 4/1992 | Goto | 372/46 |

FOREIGN PATENT DOCUMENTS

| | | |
|---|---|---|
| 58-96790 | 6/1983 | Japan . |
| 2079524 | 1/1982 | United Kingdom . |
| 2175442 | 11/1986 | United Kingdom . |

OTHER PUBLICATIONS

N. K. Dutta et al., "Fabrication and Performance Characteristics of InGaAsP Ridge-Guide Distributed-Feedback Multi-Quantum-Well Lasers", *Electronics Letters*, vol. 21, No. 13, Jun. 20, 1985, (Stevenage, Herts, GB), pp. 571,573.

Patent Abstracts of Japan, vol. 7, No. 194 (E-154)(1339), 124 Aug. 1983.

*Primary Examiner*—William Mintel
*Attorney, Agent, or Firm*—Nixon & Vanderhye

[57] ABSTRACT

A semiconductor device for amplifying radiation comprises an n-type substrate (1), a p-type layer (3) between which is located an active layer (2). Portions of the p-type layer (3) are removed by an etching process to create a central contact portion (11). Typically, the p-type layer portions are removed by an etching process in combination with a photoresist mask deposited on the top surface of the p-type layer (3). By using an etching process the contact portion can be shaped so that the photoresist layer then overhangs the contact portion (11). N-type ions are then implanted into the active layer (2) where the p-type layer (3) has been removed and the overhanging photoresist layer (4) creates non-implanted regions (10) in the active layer (20) which separates the implanted regions (8, 9) from the contact portion (11). The implanted regions (8, 9) have the effect of creating a potential barrier between the non-implanted regions of the first layer and the implanted regions and this prevents current injected into the contact portion (11) from spreading horizontally in the active layer (2).

19 Claims, 1 Drawing Sheet

SEMICONDUCTOR LIGHT EMITTING DEVICE WITH RIDGED CONTACT

The invention relates to semiconductor devices which emit radiation.

semiconductor lasers operating in the 1.3 um to 1.5 um wavelength region of the electromagnetic spectrum typically comprise an active layer such as Indium Gallium Arsenide Phosphide (InGaAsP), constituting the optical amplifying medium, which is sandwiched between a layer of a p-type doped semiconductor such as Indium Phosphide (InP) and a layer of a n-type doped semiconductor. A voltage is applied to one of the doped layers and a current passes from that layer across the active layer and into the other layer.

In these semiconductor laser devices either the p-type layer or the n-type layer forms a substrate for the device, the surface of which is covered by the active pt om some cases a buffer layer and then the active layer. The other doped layer is then deposited on top of the active layer. Part of the upper doped layer is then removed to leave a narrow linear ridge of doped material on top of the active layer. An electrical contact is usually formed on the top surface of this ridge so that an electrical voltage may be applied to the upper doped layer to inject a current into the device to excite the optical amplifying mechanism of the active layer and hence generate radiation.

A problem with these types of devices is that the current from the doped ridge spreads in the active layer away from the doped ridge instead of passing directly through the active layer into the doped substrate. This effect is undesirable because it wastes current as only the current passing directly through the active layer under the ridge is used for radiation generation; variations in the refractive index are another well known side effect.

In accordance with an aspect of the present invention, a semiconductor device for emitting radiation comprises a substrate of a first conductivity type; a first layer having a low carrier concentration comprising a radiation emitting medium on the substrate; and a contact portion in the form of a ridge on the opposite side of the first layer from the substrate to which a voltage is applied, the contact portion being of a second conductivity type opposite to the first conductivity type and regions of the first layer adjacent to the contact portion are implanted with ions of the first conductivity type, wherein the concentration of the ions implanted into the first layer is such that a potential barrier is created between the implanted regions and regions of the first layer adjacent to the implanted regions which substantially reduces current leakage from the adjacent regions of the first layer under the contact portion into other regions of the first layer.

The conductivity type of the material depends on the carrier concentrations in the material; this, in turn, will depend largely on the amount and species of dopant or dopants present in the material, although the composition of the host material is also relevant in this respect.

In accordance with another aspect of the present invention, a method of constructing a semiconductor device for emitting radiation comprises the steps of forming on a crystalline substrate of a first conductivity type, a first layer comprising a radiation emitting medium and the first layer having a low carrier concentration; forming on the opposite side of the first layer from the substrate a second layer of a second conductivity type; removing portions of the second layer to form a contact portion in the form of a ridge on the first layer to which a voltage may be applied; and implanting ions of the first conductivity type in regions of the first layer which have been exposed by the removing of portions of the second layer, wherein the concentration and location of the ions implanted into the first layer is such that a potential barrier is created between the implanted regions and regions of the first layer adjacent to the implanted regions which substantially reduces current leakage from the adjacent regions of the first layer under the contact portion into other regions of the first layer when a voltage is applied to the contact portion.

By creating a potential barrier in this manner the current is confined in the first layer to the regions covered by the contact portion.

The conductivity type of the material will generally be determined by appropriate doping.

In the preferred embodiment, the emitted radiation is generated by stimulated emission. However, the radiation may also be generated by spontaneous emission. Stimulated emission may be employed to amplify an incident optical signal.

Preferably, regions of the substrate adjacent to the implanted regions of the first layer are also implanted with ions of the first conductivity type.

In the preferred embodiment the substrate comprises a buffer layer adjacent to the first layer which has a lower carrier density than the rest of the substrate. Typically, the carrier density in the buffer layer is substantially equal to the carrier density of the implanted regions in the first layer.

Typically, the device generates and/or amplifies radiation in the optical region of the spectrum. The term "optical" in this context means radiation in the visible, infra red and ultraviolet regions of the electromagnetic spectrum. For many communication and related applications the presently preferred wavelength regions lie in the visible and infra-red parts of the spectrum.

In the preferred embodiment, the first layer comprises three subsidiary layers, one of which comprises the majority of the radiation emitting medium.

In the preferred embodiment, the first layer and then the second layer are formed on the substrate by an epitaxial growth process. Typically, this could be by Metallo Organic Vapour Phase Epitaxy (MOVPE). However, the layers could be formed by other crystal growth techniques such as Liquid Phase Epitaxy or Molecular Beam Epitaxy (MBE).

Preferably, the implanted regions in the first layer are not directly adjacent to the contact portion so that there is a region of the first layer which lies between the implanted regions in the first layer and the regions of the first layer under the contact portion.

In the preferred embodiment the contact portion is formed by depositing and subsequently patterning a photoresist layer onto the second layer and using an etchant to remove the portions of the second layer not covered by the photoresist layer.

Preferably, the regions in the first layer which are adjacent to the implanted regions but which are not under the contact portion are formed by etching away the second layers so that the photoresist layer overhangs the resulting contact portion and so that regions on the first layer directly beneath the overhanging photoresist layer are shielded from ion implantation.

Typically, the substrate and the second layer have an ion density of $10^{19}$ cm$^{-3}$ and the implanted regions in the first layer have an ion density of $10^{17}$ cm$^{-3}$. In the preferred embodiment where there is also a buffer layer in the substrate, the buffer layer would also typically have an ion concentration of $10^{17}$ cm$^{-3}$.

Nominally, the potential barrier has an amplitude in the region of 1 mV to 50 mV and typically has a nominal value of between substantially 10 mV and 20mV.

In the preferred embodiment the second layer is doped with positive ions and the substrate is doped with negative ions, However, the device could have positive ions in the substrate and negative ions in the second layer, An example of a semiconductor device according to the invention will now be described with reference to the accompanying drawings, in which:

FIGS. 1 to 4 show four successive steps in the manufacture of a device.

FIG. 1 shows a crystalline Indium Phosphide (InP) substrate 1 which is heavily doped with negative ions A crystal growth technique such as MOVPE, MOCVD, Liquid Phase Epitaxy or Molecular Beam Epitaxy is then used to epitaxially grow an active layer 2 onto the substrate I. In this particular example the active layer 2 is Gallium Indium Arsenide Phosphide (GainAsP). The active layer comprises three subsidiary layers: a radiation emitting layer, a buffer layer and an edge stop layer. Although the radiation emitting layer is the main source of the radiation emitted by the device the edge stop layer also emits a small amount of radiation. On top of the active layer 2, a positively ion doped (p-type) InP layer 3 is epitaxially grown to complete the structure.

Figure 2:
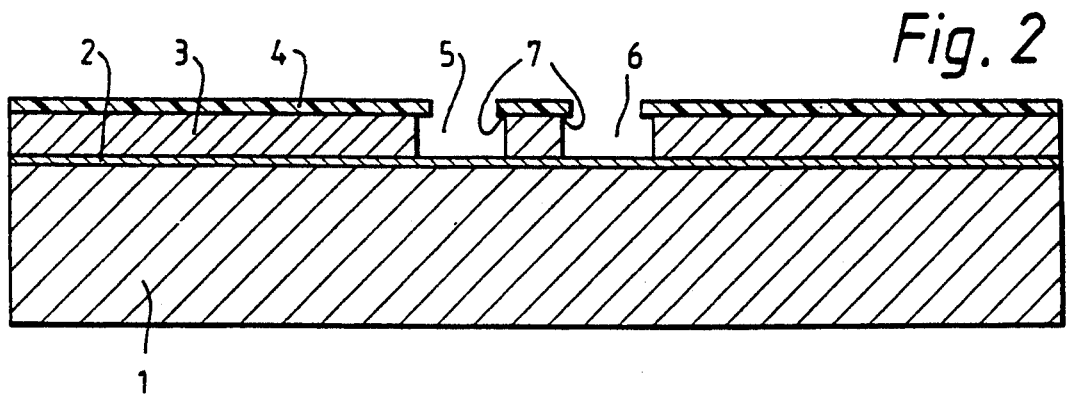

In order to manufacture the device from the above described structure a photoresist layer 4 is deposited on the top surface of the p-type layer 3 and then subsequently patterned. This enables the p-type layer 3 to be etched away from the regions where there is no photoresist covering the p-type layer 3 to form a ridge 11. This is shown in FIG. 2, where the exposed p-type layer 3 has been etched away using a conventional etching technique to produce two etched channels 5, 6 which form the ridge 11 of p-type material in the p-type layer 3. By a careful choice of the etchant and/or varying the time for which the etchant is in contact with the p-type layer, the amount of undercut 7 beneath the photoresist can be varied.

Figure 3:
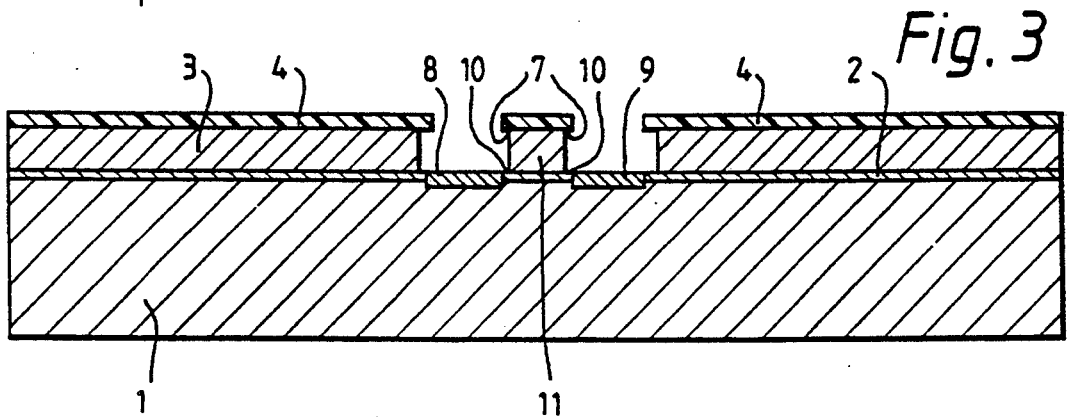

As shown in FIG. 3, n-type silicon ions are then implanted into the active layer 2 in regions 8, 9 at the bottom of the channels 5, 6 with the photoresist acting as a mask. As the p-type layer 3 is etched away underneath the photoresist layer 4 to form the undercuts 7 and the silicon ions are deposited vertically downwards, a Gap 10 is created between the regions 8, 9 and the ridge 11. If the implanted regions 8, 9 are directly adjacent to the ridge 11, when the device is annealed at high temperatures the regions 8, 9 would move by diffusion into the regions of the active layer 2 beneath the ridge 11. This would reduce the lifetime of the finished device and is therefore undesirable.

Figure 4:
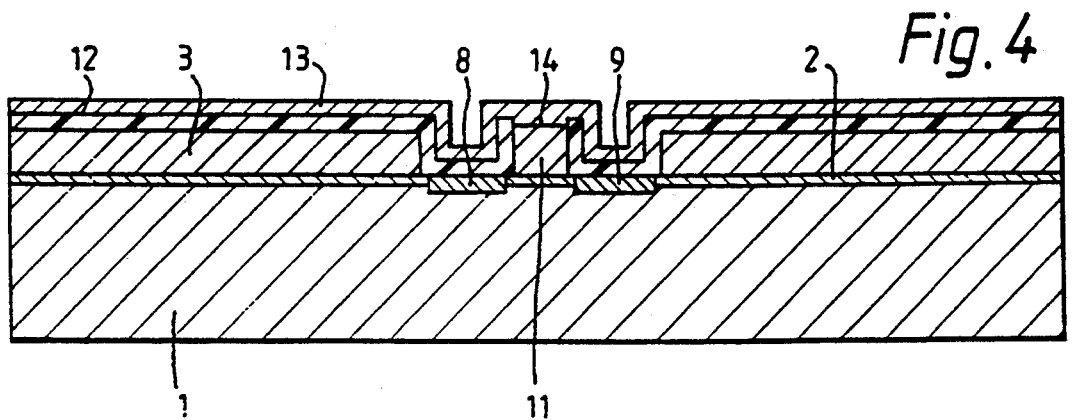

After the active layer has been implanted with silicon ions in the regions 8, 9 the photoresist layer 4 is removed and an insulating oxide layer 12 is applied to all the exposed surfaces. Where the electrical contact is to be made with the device to apply a voltage the oxide layer 12 is subsequently removed. In this example electrical contact is made on the top surface 14 of the ridge 11 and hence the oxide layer has been removed from this area. A contact metal layer 13 is then applied over the whole surface of the device. As can be seen in FIG. 4 although contact layer 13 covers the entire surface, electrical contact only occurs at the top surface 14 of the ridge 11. The contact layer 13 in all other areas is insulated from the device by the insulating oxide layer 12.

So that the contact metal layer 13 forms a good contact with the top of the ridge 11, the top of the ridge 11 may be GainAs (for InP lasers) or GaAs (for GaAs lasers).

Typically, the substrate 1 and the p-type layer 3 have ion concentrations of about $10^{19}$ cm$^{-3}$ and the implanted regions 8, 9 have ion concentrations of about $10^{17}$ cm$^{-3}$ to $10^{18}$ cm$^{-3}$. Generally, the active layer 2 is undoped, however in certain cases it may be lightly doped. Usually, the substrate 1 also comprises a buffer layer (not shown) which has an ion concentration similar to the ion concentration of the implanted regions 8, 9 and is situated adjacent to the active layer 2. Typically, the active layer 2 has a thickness of approximately 0.15 um to 0.2 um.

In use, a voltage is applied to the contact metal layer 13. As the contact layer 13 makes electrical contact with the top surface 14 of the ridge 11, a voltage is created between the p-type material in the ridge 11 and the n-type material in the substrate 1 which causes a current to flow between the layers. The current will flow from the ridge 11 through the active layer 2 and into the substrate 1. If there were no implanted regions 8, 9 the current would enter the active layer 2 and spread horizontally away from the ridge 11. This produces undesirable effects because it wastes current and changes the refractive index of the active layer as a direct result of carrier density changes due to the spreading current.

However, with the implanted regions 8, 9 present, a small potential barrier is created in the active layer 2 adjacent to the edges of the ridge 11. Typically this barrier would be 10 mV for an implanted ion concentration of $10^{17}$ cm$^{-2}$ to $10^{18}$ cm$^{-2}$ in the implanted regions 8, 9. This size of barrier is sufficient to reduce current spreading by diffusion and any small drift current that may be present. Hence, the current is confined to the region of the active layer 2 directly below the ridge 11 so that the maximum concentration of current is available for excitation of the electrons to create stimulated emission.

Typically, the ridge 11 has a cleaved face at both ends and the cleaved faces act as reflectors to reflect radiation emitted by excited electrons decaying to a lower state so that stimulated emission can occur in sufficient quantities to produce lasing. Typically the threshold current for lasing is approximately 20 mA to 50 mA. These type of devices typically give a 5 mw output power of radiation at a current of about 45 mA and emit radiation in the 1.55 um region of the electromagnetic spectrum.

The type of structure described here may also be incorporated into more complicated devices such as buried ridge waveguide devices.

I claim:

1. A light-emitting semiconductor device comprising a substrate, a first layer being an active layer on the substrate and a second layer forming a ridged contact portion on the active layer, wherein a potential barrier is formed by ion implantation into the active layer alongside the ridged contact portion.

2. A semiconductor device as claimed in claim 1, wherein the active layer comprises a plurality of subsidiary layers.

3. A semiconductor device as claimed in claim 1 having a buffer layer between the substrate and active layer.

4. A semiconductor device for emitting radiation comprising a substrate of a first conductivity type; a first layer having a low carrier concentration and comprising a radiation emitting medium on the substrate; and a contact portion in the form of a ridge on the opposite side of the first layer from the substrate to which a voltage is applied in use, the contact portion being of second conductivity type opposite to the first conductivity type and regions of the first layer adjacent to the contact portion implanted with ions of the first conductivity type, wherein the concentration of the ions implanted into the first layer is such that a potential barrier is created between the implanted regions and regions of the first layer adjacent to the implanted regions which substantially reduces current leakage from the regions of the first layer adjacent to the implanted regions and under the contact portion into other regions of the first layer.

5. A semiconductor device according to claim 1 wherein the implanted regions in the first layer are separated from the contact portion by a region of the first layer which is not implanted.

6. A semiconductor device according to claim 1 wherein the substrate comprises a buffer layer adjacent to the first layer which has a lower carrier density than the rest of the substrate.

7. A semiconductor device according to claim 1 wherein the emitted radiation is generated by stimulated emission.

8. A semiconductor device according to claim 7, wherein the emitted radiation is the result of amplification of an incident optical signal.

9. A semiconductor device according to claim 1 wherein emitted radiation is generated by spontaneous emission.

10. A semiconductor device according to claim 1 wherein radiation is optical.

11. Semiconductor device according to claim 1 wherein implanted regions have a carrier density of not less than substantially $10^{17}$ cm$^{-3}$.

12. A semiconductor device according to claim 11, wherein the implanted regions have a carrier density not greater than substantially $10^{19}$ cm$^{-3}$.

13. A semiconductor device according to claim 1 comprising a binary composition of materials from groups III and V of the periodic table.

14. A method of constructing a semiconductor device for emitting radiation, the method comprising the steps of forming on a crystalline substrate of a first conductivity type, a first layer comprising a radiation emitting medium and the first layer having a low carrier concentration, forming on the opposite side of the first layer from the substrate a second layer of a second conductivity type; removing portions of the second layer to form a contact portion in the form of a ridge on the first layer to which a voltage may be applied; and implanting ions of the first conductivity type in regions of the first layer which have been exposed by the removing of portions of the second layer, wherein the concentration and location of the ions implanted into the first layer is such that a potential barrier is created between the implanted regions and regions of the first layer adjacent to the implanted regions which substantially reduces current leakage from the regions of the first layer under the contact portion into other regions of the first layer when a voltage is applied to the contact portion.

15. A method according to claim 14, wherein the ions are implanted into the first layer such that there are regions in the first layer adjacent to the implanted regions separating the contact portion from the implanted regions.

16. A method according to claim 15, wherein the regions of the first layer which separate the implanted regions of the first layer from the contact portion are formed by removing portions of the second layer from beneath a protective layer such that the protective layer overhangs and shields exposed regions of the first layer from implantation.

17. A method according to claim 16, wherein the protective layer is a photoresist layer and the portions of the second layer are removed by an etching process.

18. A semiconductor device as in claim 1 comprising a quaternary composition of materials from groups III and V of the periodic table.

19. A semiconductor device as in claim 1 comprising a quaternary composition of materials from groups III and V of the periodic table.

* * * * *